US009842781B2

United States Patent
Lee et al.

(10) Patent No.: US 9,842,781 B2
(45) Date of Patent: Dec. 12, 2017

(54) ELECTROSTATIC CHUCK SYSTEM AND METHOD OF MANUFACTURING ORGANIC LIGHT-EMITTING DISPLAY APPARATUS BY USING THE SAME

(71) Applicant: SAMSUNG DISPLAY CO., LTD., Yongin, Gyeonggi-Do (KR)

(72) Inventors: Duckjung Lee, Yongin (KR); Jaesik Kim, Yongin (KR); Hyunsung Bang, Yongin (KR); Jungsun Park, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 156 days.

(21) Appl. No.: 14/747,046

(22) Filed: Jun. 23, 2015

(65) Prior Publication Data
US 2016/0161865 A1 Jun. 9, 2016

(30) Foreign Application Priority Data

Dec. 9, 2014 (KR) .................. 10-2014-0175880

(51) Int. Cl.
*H01L 21/66* (2006.01)
*H01L 51/52* (2006.01)
(Continued)

(52) U.S. Cl.
CPC .......... *H01L 22/20* (2013.01); *H01L 51/5284* (2013.01); *H01L 51/0013* (2013.01); *H01L 51/56* (2013.01)

(58) Field of Classification Search
CPC .... H01L 21/6831; H01L 21/6833; H02N 3/00
(Continued)

(56) References Cited

U.S. PATENT DOCUMENTS

2005/0016471 A1  1/2005  Chiang et al.
2007/0223173 A1*  9/2007  Fujisawa ............... H02N 13/00
                                                     361/234
(Continued)

FOREIGN PATENT DOCUMENTS

JP  2010-153045 A  7/2010
JP  2010-199177 A  9/2010
(Continued)

OTHER PUBLICATIONS

Takashi Hirano, et al., "Novel Laser Transfer Technology for Manufacturing Large-Size OLED Display", Display Device Development Group, Sony Corporation, SID 07, Paper 276, pp. 1-5, 2007.

*Primary Examiner* — Dharti Patel
(74) *Attorney, Agent, or Firm* — Lee & Morse P.C.

(57) ABSTRACT

An electrostatic chuck system includes an electrostatic chuck with a plurality of unit chucks supporting a display substrate, an optical photomask on the display substrate, the optical photomask having a material to be transferred onto the display substrate, a light source on the optical photomask, a gap measuring meter for measuring a gap between the display substrate and the optical photomask, a power source unit for applying power to each of the plurality of unit chucks through variable resistance units respectively connected to the plurality of unit chucks, and a control unit electrically connected to the gap measuring meter, the variable resistance units, and the power source unit, and transmits a signal for adjusting the gap.

5 Claims, 9 Drawing Sheets

(51) Int. Cl.
  *H01L 51/56* (2006.01)
  *H01L 51/00* (2006.01)
(58) Field of Classification Search
  USPC .......................................................... 361/234
  See application file for complete search history.

(56) References Cited

U.S. PATENT DOCUMENTS

| | | |
|---|---|---|
| 2009/0059461 A1 | 3/2009 | Yonekura et al. |
| 2010/0084676 A1 | 4/2010 | Tanaka |
| 2011/0013338 A1 | 1/2011 | Fujii |
| 2013/0279066 A1 | 10/2013 | Lubomirsky et al. |
| 2014/0154819 A1 | 6/2014 | Gaff et al. |
| 2015/0116889 A1* | 4/2015 | Yamasaki ............... H02N 13/00 361/234 |
| 2015/0146339 A1* | 5/2015 | Raj ..................... H01L 21/6831 361/234 |

FOREIGN PATENT DOCUMENTS

| | | |
|---|---|---|
| JP | 2011-181462 A | 9/2011 |
| KR | 10-2008-0001336 A | 1/2008 |
| KR | 10-2008-0107473 A | 12/2008 |
| KR | 10-2009-0023061 A | 3/2009 |
| KR | 10-2011-0025686 A | 3/2011 |
| KR | 10-2012-0046143 A | 5/2012 |

* cited by examiner

ELECTROSTATIC CHUCK SYSTEM AND METHOD OF MANUFACTURING ORGANIC LIGHT-EMITTING DISPLAY APPARATUS BY USING THE SAME

CROSS-REFERENCE TO RELATED APPLICATION

Korean Patent Application No. 10-2014-0175880, filed on Dec. 9, 2014, in the Korean Intellectual Property Office, and entitled: "Electrostatic Chuck System and Method of Manufacturing Organic Light-Emitting Display Apparatus by Using the Same," is incorporated by reference herein in its entirety.

BACKGROUND

1. Field

One or more exemplary embodiments relate to an electrostatic chuck system and a method of manufacturing an organic light-emitting display apparatus by using the same.

2. Description of the Related Art

Commonly, an organic light-emitting display apparatus may be used for mobile devices, e.g., smartphones, tablet PCs, laptop computers, digital cameras, camcorders, and portable information terminals, and electronic devices, e.g., ultra-thin TVs and advertisement boards. The organic light-emitting display apparatus includes an organic emission layer interposed between an anode and a cathode. The organic emission layer may be formed in an emission area on a display substrate by various methods. For example, a deposition process, a print process, or a laser-induced thermal imaging (LITI) process may be used. The LITI process may allow the organic emission layer to be minutely patterned. be used for a large area, and realize high resolution.

SUMMARY

One or more exemplary embodiments include an electrostatic chuck system and a method of manufacturing an organic light-emitting display apparatus by using the same.

According to one or more exemplary embodiments, an electrostatic chuck system includes: an electrostatic chuck which has a plurality of unit chucks and on which a display substrate is mounted; an optical photomask mounted on the display substrate and having a material to be transferred onto the display substrate; a light source mounted on the optical photomask; a gap measuring meter for measuring a gap between the display substrate and the optical photomask; a power source unit for applying power to each of the plurality of unit chucks through variable resistance units respectively connected to the plurality of unit chucks; and a control unit which is electrically connected to the gap measuring meter, the variable resistance units, and the power source unit and transmits a signal for adjusting the gap.

Each of the plurality of unit chucks may include: at least one electrode; and a dielectric layer for burying the at least one electrode, wherein the at least one electrode is electrically connected to a variable resistance unit.

The plurality of unit chucks may be arranged to adjoin each other, and the display substrate may be arranged on and across the plurality of unit chucks.

The optical photomask may include: an optical substrate having a first surface facing the display substrate and a second surface at an opposite side of the first surface; an optical function layer having an optical reflective layer and an optical absorption layer formed on the first surface of the optical substrate; and a transfer layer which is formed on the optical absorption layer and of which at least a portion contacts the optical absorption layer.

A first insulating layer may be formed between the optical reflective layer and the optical absorption layer.

The optical reflective layer may be formed between the optical substrate and the first insulating layer, have an opening patterned to correspond to a portion corresponding to an emission area of the display substrate, and be formed at a portion corresponding to a non-emission area of the display substrate.

The optical absorption layer may be formed on the first insulating layer and at a portion corresponding to an emission area of the display substrate.

A second insulating layer may be formed between the optical absorption layer and the transfer layer.

The transfer layer may be formed on the second insulating layer, be formed at a portion corresponding to an emission area of the display substrate, and directly contact the optical absorption layer.

The electrostatic chuck system may further include a conductive layer formed below the second surface of the optical substrate.

The conductive layer may include: a first conductive layer covering the second surface of the optical substrate and having a transparent conductive film; and a second conductive layer formed below the first conductive layer and having a metallic film in which an opening patterned to correspond to a portion corresponding to an emission area of the display substrate is formed.

The gap measuring meter may be mounted apart from the optical photomask to measure a path difference of light irradiated onto a light-reflective pattern formed on each of facing surfaces of the display substrate and the optical photomask.

Each of the variable resistance units may be independently connected for each unit chuck, and a resistance value thereof may be variably changed by regulating the power source unit.

According to one or more exemplary embodiments, a method of manufacturing an organic light-emitting display apparatus by using an electrostatic chuck system includes: depositing a transfer layer on an optical photomask; aligning a display substrate and the optical photomask on an electrostatic chuck having a plurality of unit chucks; adjusting a gap between the display substrate and the optical photomask by regulating a voltage through variable resistance units respectively connected to the plurality of unit chucks; and forming a transfer layer, which has been deposited on the optical photomask by irradiating light on the optical photomask, on the display substrate in an emission area by transferring the transfer layer onto the display substrate.

The optical photomask may have an optical reflective layer formed at a portion corresponding to a non-emission area of the display substrate and an optical absorption layer formed at a portion corresponding to the emission area of the display substrate such that the optical absorption layer directly contacts the transfer layer, and light irradiated from a light source may be absorbed by the optical absorption layer so that the transfer layer contacting the optical absorption layer is transferred onto the display substrate.

The adjusting of the gap between the display substrate and the optical photomask may include: measuring the gap between the display substrate and the optical photomask; transmitting a measurement value measured for each position of the display substrate to a control unit; and adjusting the gap between the display substrate and the optical photomask by regulating a voltage to be applied to each of the plurality of unit chucks through the variable resistance units respectively connected to the plurality of unit chucks based on the measurement value.

A gap measuring meter may be mounted apart from the optical photomask to measure the gap between the display substrate and the optical photomask from a light path difference by irradiating light from the gap measuring meter onto a plurality of light-reflective patterns formed on facing surfaces of the display substrate and the optical photomask.

The gap between the display substrate and the optical photomask may be adjusted by regulating the voltage to be applied to each of the plurality of unit chucks according to a variable resistance value transmitted from the control unit.

Resistance values of the variable resistance units may be variably changed by the control unit in real-time.

A same voltage may be applied to the plurality of unit chucks, and the voltage to be applied to each of the plurality of unit chucks may be regulated according to the gap between the display substrate and the optical photomask.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
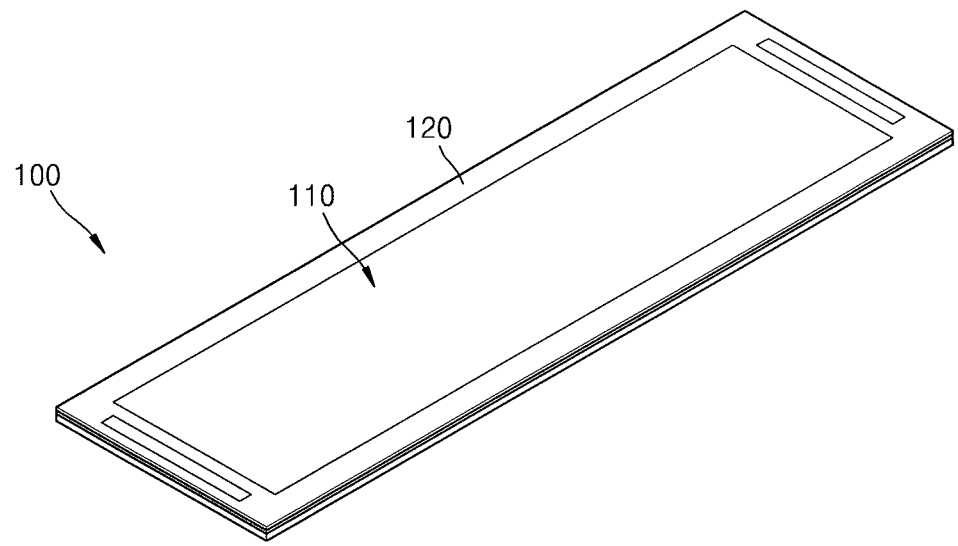
FIG. 1 illustrates a perspective view of a display device in an unrolled form, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms "first", "second", etc. may be used herein to describe various components, these components should not be limited by these terms. These components are only used to distinguish one component from another.

The terminology used in the application is used only to describe specific embodiments and does not have any intention to limit. An expression in the singular may include an expression in the plural unless they are clearly different from each other in context. In the application, it should be understood that terms, such as 'include' and 'have', are used to indicate the existence of an implemented feature, number, step, operation, element, part, or a combination thereof without excluding in advance the possibility of the existence or addition of one or more other features, numbers, steps, operations, elements, parts, or combinations thereof.

As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of an electrostatic chuck system and a method of manufacturing an organic light-emitting display apparatus by using the same will now be described in detail with reference to the accompanying drawings.

Figure 2:
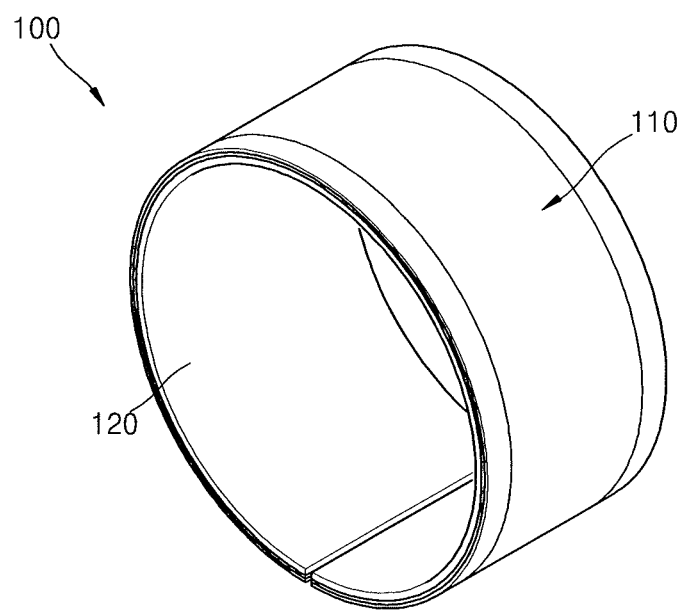
FIG. 2 illustrates a perspective view of the display device of FIG. 1 in a rolled form.

FIG. 1 is a perspective view of a display device 100 in an unrolled form, according to an embodiment, and FIG. 2 is a perspective view of the display device 100 in a rolled form. Herein, although it will be described that the display device 100 is a flexible display device as an example, the display device 100 may have rigidity.

Referring to FIGS. 1 and 2, the display device 100 may include a flexible display panel 110 for displaying an image and a flexible case 120 for accommodating the flexible display panel 110. The flexible display panel 110 may include not only elements for implementing a screen but also various films, e.g., a touch screen, a polarizing plate, a window cover, and the like. The flexible display device 100 allows a user to view an image at various angles, such as in an unrolled state, a rolled state, and the like. Although it is described in the present embodiment that the display device 100 is an organic light-emitting display apparatus as an example, the display device 100 may be one of various flexible display devices, e.g., a liquid crystal display (LCD), a field emission display, an electronic paper display, and the like.

Figure 3:
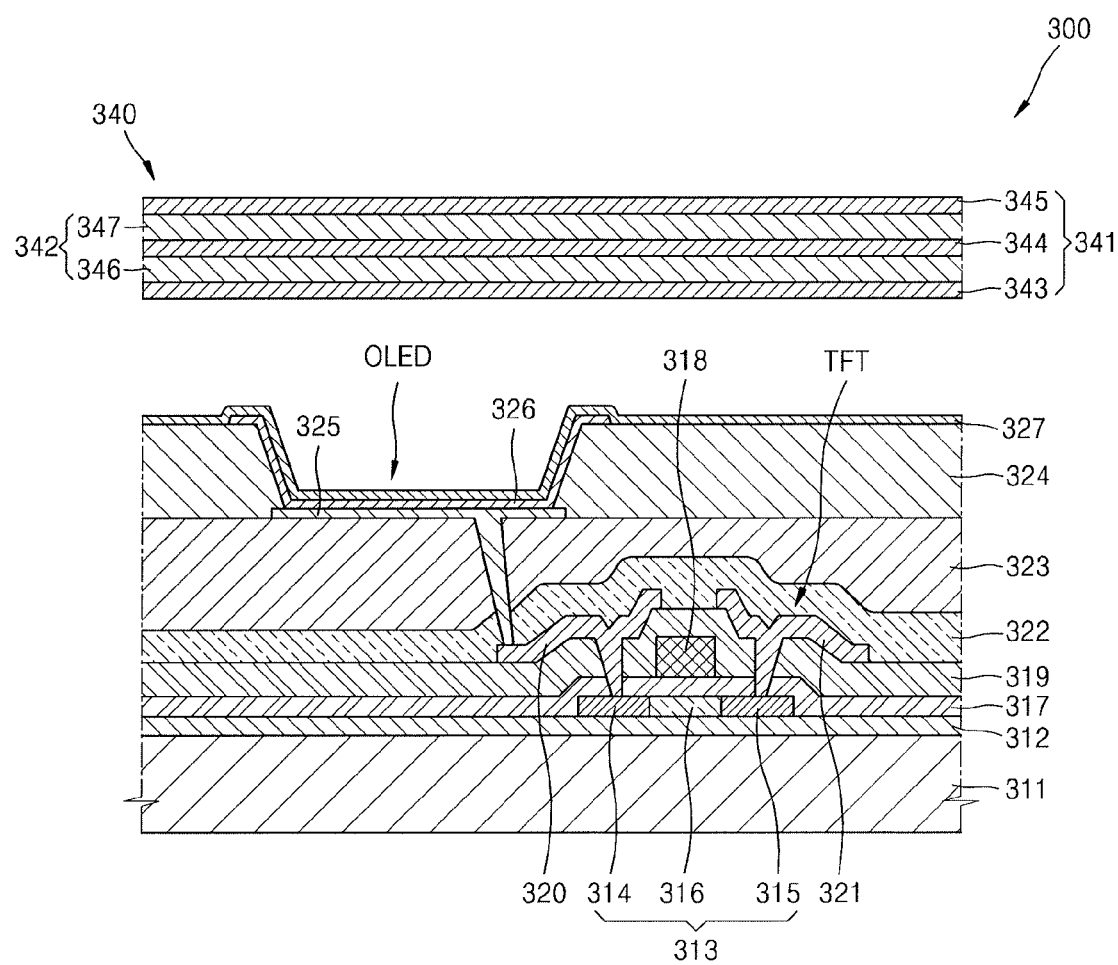
FIG. 3 illustrates a cross-sectional view of one sub-pixel of a display device according to an embodiment.

FIG. 3 is a cross-sectional view of one sub-pixel of a display device 300 according to an embodiment. The display device 300 may be identical to the display device 100 described previously.

The sub-pixel in FIG. 3 may include at least one thin-film transistor (TFT) and an organic light-emitting device OLED, e.g., an organic light-emitting diode. The TFT is not necessarily limited to the structure in FIG. 3, and the number of TFTs and structures of the TFTs may be modified in various ways.

Referring to FIG. 3, the display device 300 may include a display substrate 311 and an encapsulation layer 340 facing the display substrate 311.

The display substrate 311 may be formed of a flexible insulating material. For example, the display substrate 311 may be a polymer substrate formed of, e.g., polyimide (PI), polycarbonate (PC), polyethersulphone (PES), polyethylene terephthalate (PET), polyethylene naphthalate (PEN), polyarylate (PAR), fiber glass reinforced plastic (FRP), or the like. In another example, the display substrate 311 may be a flexible glass substrate. The display substrate 311 may be transparent, translucent, or opaque.

A barrier layer 312 may be formed on the display substrate 311. The barrier layer 312 may completely cover a surface of the display substrate 311. The barrier layer 312 may be formed of an inorganic material, e.g., silicon oxide ($SiO_x$), silicon nitride ($SiN_x$), silicon oxynitride ($SiO_xN_y$), aluminum oxide ($AlO_x$), aluminum nitride ($AlN_x$), or the like, or an organic material, e.g., acryl, PI, polyester, or the like. The barrier layer 312 may be formed as a single-layer film or a multi-layer film. The barrier layer 312 may block oxygen and moisture and planarize the surface of the display substrate 311.

A TFT may be formed on the barrier layer 312. Although it is described in the present embodiment that the TFT is a top gate transistor, the TFT may have another structure, such as a bottom gate transistor.

A semiconductor active layer 313 may be formed on the barrier layer 312. The semiconductor active layer 313 may include a source region 314 and a drain region 315 formed by doping parts of the semiconductor active layer 313 with N-type or P-type impurity ions. A region between the source region 314 and the drain region 315 that is not doped with impurities is a channel region 316.

The semiconductor active layer 313 may include amorphous silicon, an organic semiconductor, or an inorganic semiconductor such as polysilicon. For example, the semiconductor active layer 313 may be an oxide semiconductor. For example, the oxide semiconductor includes an oxide of at least one of 4-, 12-, 13-, and 14-group metallic elements, e.g., zinc (Zn), indium (In), gallium (Ga), tin (Sn), cadmium (Cd), germanium (Ge), and hafnium (Hf), and a combination thereof.

A gate insulating layer 317 may be deposited on the semiconductor active layer 313. The gate insulating layer 317 may be an inorganic layer of $SiO_x$, $SiN_x$, a metal oxide, or the like. The gate insulating layer 317 may be a single-layer film or a multi-layer film.

A gate electrode 318 may be formed on the gate insulating layer 317. The gate electrode 318 may include a single-layer film or a multi-layer film of, e.g., gold (Au), silver (Ag), copper (Cu), nickel (Ni), platinum (Pt), palladium (Pd), Al, molybdenum (Mo), chromium (Cr), or the like. According to an embodiment, the gate electrode 318 may include an alloy, e.g., Al:neodymium (Nd) or Mo:tungsten (W).

An interlayer insulating layer 319 may be formed on the gate electrode 318. For example, the interlayer insulating layer 319 may be formed of an inorganic material, e.g., $SiO_x$, $SiN_x$, or the like. In another example, the interlayer insulating layer 319 may include an organic material.

A source electrode 320 and a drain electrode 321 may be formed on the interlayer insulating layer 319. In detail, contact holes may be formed in the gate insulating layer 317 and the interlayer insulating layer 319 by selectively removing parts of the gate insulating layer 317 and the interlayer insulating layer 319, wherein the source electrode 320 is electrically connected to the source region 314 through one contact hole, and the drain electrode 321 is electrically connected to the drain region 315 through the other contact hole.

A passivation layer 322 may be formed on the source electrode 320 and the drain electrode 321. The passivation layer 322 may be formed of an inorganic material, e.g., $SiO_x$ or $SiN_x$, or an organic material.

A planarization layer 323 may be formed on the passivation layer 322. The planarization layer 323 may include an organic material. e.g., acryl, PI, benzocyclobutene (BCB), or the like. Any of the passivation layer 322 and the planarization layer 323 may be omitted.

The TFT may be electrically connected to the organic light-emitting device OLED. The organic light-emitting device OLED may be formed on the planarization layer 323. The organic light-emitting device OLED may include a first electrode 325, an intermediate layer 326, and a second electrode 327.

The first electrode 325 functions as an anode and may be formed of various conductive materials. The first electrode 325 includes a transparent electrode or a reflective electrode. For example, when the first electrode 325 is used as a transparent electrode, the first electrode 325 includes a transparent conductive layer of, e.g., indium tin oxide (ITO), indium zinc oxide (IZO), zinc oxide (ZnO), indium oxide ($In_2O_3$), or the like. When the first electrode 325 is used as a reflective electrode, the first electrode 325 may include a reflective layer formed of, e.g., Ag, magnesium (Mg), Al, Pt, Pd, Au, Ni, Nd, iridium (Ir), Cr, or a composition thereof and thereafter include a transparent layer of ITO, IZO, ZnO, $In_2O_3$, or the like on the reflective layer.

A pixel-defining layer 324 is formed on the planarization layer 323. The pixel-defining layer 324 covers a portion of the first electrode 325. The pixel-defining layer 324 may define an emission region of each sub-pixel by surrounding an edge of the first electrode 325. The first electrode 325 may be patterned for each sub-pixel.

The pixel-defining layer 324 may be an organic layer or an inorganic layer. For example, the pixel-defining layer 324 may be formed of an organic material, e.g., PI, polyamide, BCB, acryl resin, phenol resin, or the like, or an inorganic material, e.g., $SiN_x$. The pixel-defining layer 324 may be a single-layer film or a multi-layer film.

The intermediate layer 326 may be formed on the first electrode 325 in a region exposed by etching a portion of the pixel-defining layer 324. For example, the intermediate layer 326 may include an organic emission layer. In another example, the intermediate layer 326 may include the organic emission layer and may selectively further include at least one of a hole injection layer (HIL), a hole transport layer (HTL), an electron transport layer (ETL), and an electron injection layer (EIL). However, the present embodiment is not limited thereto, and the intermediate layer 326 may include the organic emission layer and may further include various other functional layers. Holes and electrons injected from the first electrode 325 and the second electrode 327, respectively, may recombine in the organic emission layer, thereby emitting light of a desired color.

The second electrode 327 may be formed on the intermediate layer 326. The second electrode 327 may function as a cathode. The second electrode 327 may include a transparent electrode or a reflective electrode. For example, when the second electrode 327 is used as a transparent electrode, the second electrode 327 may be formed by depositing a metal having a low work function, e.g., lithium (Li), calcium (Ca), lithium fluoride (LiF)/Ca, LiF/Al, Al, or Mg, or a composition thereof, on the intermediate layer 326 and further forming a transparent conductive layer of ITO, IZO, ZnO, $In_2O_3$, or the like on the metal or the composition thereof. When the second electrode 327 is used as a reflective electrode, the second electrode 327 may include, e.g., Li, Ca, LiF/Ca, LiF/Al, Al, Mg, or a composition thereof.

The first electrode 325 may function as an anode, and the second electrode 327 may function as a cathode. However, the present embodiment is not limited thereto. For example, the first electrode 325 may function as a cathode, and the second electrode 327 may function as an anode.

According to an embodiment, a plurality of sub-pixels may be formed on the display substrate 311, and red, green, blue, or white light may be emitted for each sub-pixel. However, the present embodiment is not limited thereto.

According to an embodiment, the intermediate layer 326 may be formed to be common to the first electrode 325 regardless of a location of each sub-pixel. In this case, the organic emission layer may be formed by vertically stacking layers including emission materials for emitting red, green, and blue lights, respectively, or by mixing the emission materials for respectively emitting red, green, and blue lights.

According to an embodiment, if white light is emitted, other colors may also be emitted. In this case, a color conversion layer or a color filter for converting the emitted white light into a predetermined color may be further included.

The encapsulation layer 340 may be formed to protect the organic light-emitting device OLED from external moisture, oxygen, and the like. According to an embodiment, the encapsulation layer 340 may be formed by alternately stacking an inorganic layer 341 and an organic layer 342 on the organic light-emitting device OLED.

For example, the encapsulation layer 340 may have a structure in which at least one inorganic layer 341 and at least one organic layer 342 are stacked. The inorganic layer 341 may include a first inorganic layer 343, a second inorganic layer 344, and a third inorganic layer 345. The organic layer 342 may include a first organic layer 346 and a second organic layer 347. The inorganic layer 341 may be formed of, e.g., $SiO_2$, $SiN_x$, $Al_2O_3$, titanium oxide ($TiO_2$), zirconium oxide ($ZrO_x$), or ZnO. The organic layer 342 may be formed of, e.g., epoxy, PI, PET, PC, polyethylene, or PAR.

The intermediate layer 326, e.g., the organic emission layer, may be manufactured by various methods. According to the present embodiment, the intermediate layer 326 may be formed on the display substrate 311 by using an optical photomask.

Figure 4:
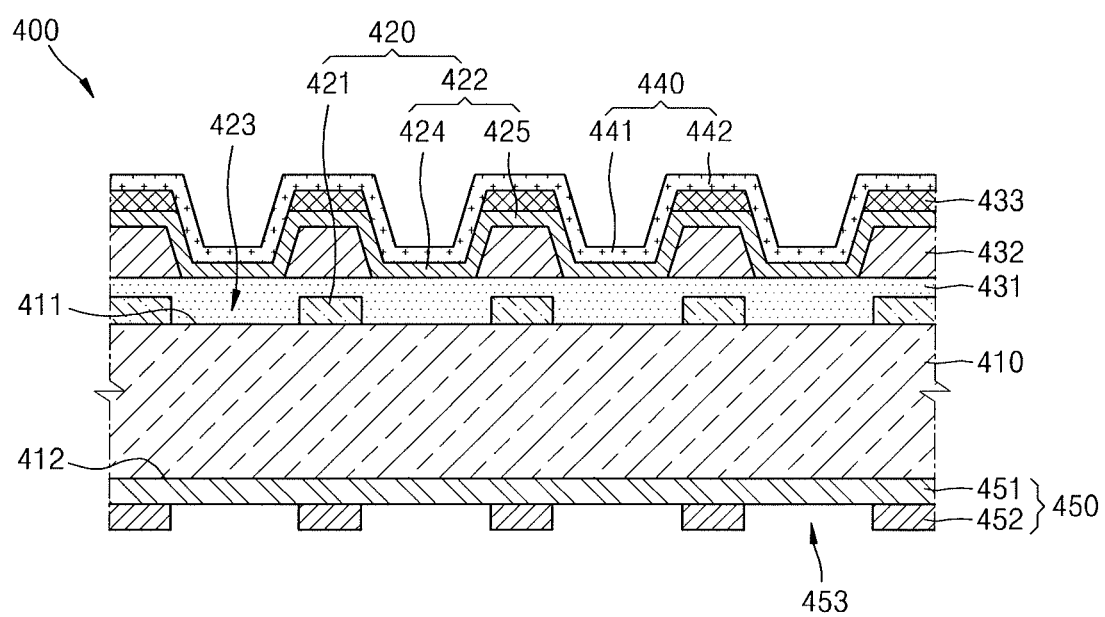
FIG. 4 illustrates a cross-sectional view of a partially cut optical photomask according to an embodiment.
Figure 5:
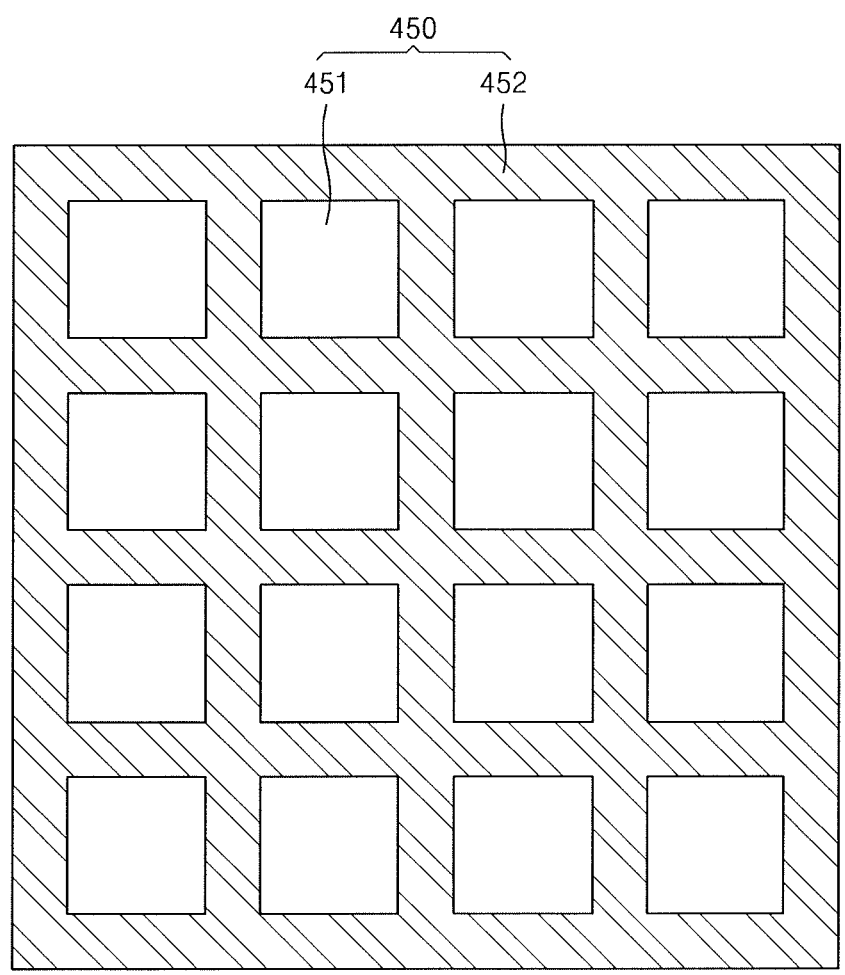
FIG. 5 illustrates a top view of a rear surface of the optical photomask of FIG. 4.

FIG. 4 is a cross-sectional view of a partially cut optical photomask 400 according to an embodiment. FIG. 5 is a top view of a rear surface of the optical photomask 400.

Referring to FIGS. 4 and 5, the optical photomask 400 may include an optical substrate 410. The optical substrate 410 may include a first surface 411 facing the display substrate 311 of FIG. 3 and a second surface 412 at an opposite side of the first surface 411. The second surface 412 is a surface on which light emitted by a light source (not shown) is irradiated. The optical substrate 410 may be a transparent substrate. According to an embodiment, the optical substrate 410 may be formed of glass or quartz.

An optical function layer 420 is formed on the first surface 411 of the optical substrate 410. The optical function layer 420 includes an optical reflective layer 421 and an optical absorption layer 422.

The optical reflective layer 421 may be formed on the first surface 411 of the optical substrate 410. The optical reflective layer 421 includes a plurality of openings 423 patterned to correspond to portions corresponding to an emission area of the display substrate 311, e.g., the optical reflective layer 421 includes a plurality of discrete portions separated from each other by the openings 423. The optical reflective layer 421 may be a thin film, e.g., of Al or the like, having a good reflective characteristic. The optical reflective layer 421 may act as an electrode.

The optical reflective layer 421 may be covered by a heat-blocking layer 431. The heat-blocking layer 431 includes an insulating material, e.g., a polymer. The heat-blocking layer 431 may be completely formed on the first surface 411 of the optical substrate 410.

A first insulating layer 432 may be formed on the heat-blocking layer 431. The first insulating layer 432 may be formed at a portion corresponding to a non-emission area surrounding the emission area of the display substrate 311, e.g., the first insulating layer 432 may be formed to overlap the discrete portions of the optical reflective layer 421. For example, the first insulating layer 432 may be formed at a portion corresponding to the pixel-defining layer 324 of FIG. 3.

The first insulating layer 432 may be a taper-shaped partition. The optical reflective layer 421 and the first insulating layer 432 may be formed at a same position in a vertical direction.

Although it is described in the present embodiment that a structure in which a two-layer structured insulating layer includes the heat-blocking layer 431 and the first insulating layer 432 is formed on the optical reflective layer 421, the present embodiment is not limited to any structure as long as the structure includes an insulating layer that covers the optical reflective layer 421 and has an opening patterned to correspond to the emission area of the display substrate 311.

The optical absorption layer 422 may be formed on the heat-blocking layer 431 and the first insulating layer 432. In detail, the optical absorption layer 422 includes a first optical absorption part 424 formed in a region between neighboring first insulating layers 432, i.e., a region through which the heat-blocking layer 431 is exposed. The region in which the first optical absorption part 424 is formed corresponds to the emission area of the display substrate 311. A second optical absorption part 425 may further extend from the first optical absorption part 424 outwards side walls and an upper surface of the first insulating layer 432. According to an embodiment, the first optical absorption part 424 and the second optical absorption part 425 may be formed in one body, e.g., the first optical absorption part 424 and the second optical absorption part 425 may be continuous with each other to define a seamless layer. For example, as illustrated in FIG. 4, the first optical absorption part 424 may be formed directly on exposed portions of the heat-blocking layer 431, while the second optical absorption part 425 may be formed on the first insulating layers 432 to contact adjacent first optical absorption part 424.

The optical absorption layer 422 may cover both the heat-blocking layer 431 and the first insulating layer 432. The optical absorption layer 422 may include a material having a good light-absorption coefficient, e.g., a material having a three-layer structure of Cr/ITO/Cr.

A second insulating layer 433 may be formed on the optical absorption layer 422. The second insulating layer 433 may be formed at a portion corresponding to the non-emission area surrounding the emission area of the display substrate 311. The second insulating layer 433 may be a taper-shaped partition. The first insulating layer 432 and the second insulating layer 433 may be located at a same position in the vertical direction.

A transfer layer 440 may be formed on the second insulating layer 433. Although it is described in the present embodiment that the transfer layer 440 is an organic emission layer included in an organic light-emitting display apparatus as an example, the transfer layer 440 may be various function layers included in an intermediate layer, e.g., a hole injection layer, a hole transport layer, an electron transport layer, an electron injection layer, and the like, besides the organic emission layer.

In detail, the transfer layer 440 includes a first transfer layer 441 formed in a region between neighboring second insulating layers 433, i.e., a region through which the first optical absorption part 424 is exposed. The region in which the first transfer layer 441 is formed corresponds to the emission area of the display substrate 311. A second transfer layer 442 may further extend from the first transfer layer 441 outward, e.g., along, side walls and an upper surface of the second insulating layer 433.

According to an embodiment, the first transfer layer 441 and the second transfer layer 442 may be formed in one body. According to an embodiment, the transfer layer 440 may cover both the optical absorption layer 422 and the second insulating layer 433.

The transfer layer 440 may be of a material transferred to the emission area of the display substrate 311. At least a portion of the transfer layer 440 may contact the optical absorption layer 422. In detail, the first transfer layer 441 may directly contact the first optical absorption part 424. In addition, the second transfer layer 442 may directly contact the second insulating layer 433, e.g., and at least a portion of the second optical absorption part 425. The present embodiment is not limited to any structure as long as the structure is the same as the one of the present embodiment in which the transfer layer 440 directly contacts the optical absorption layer 422 at a portion corresponding to the emission area of the display substrate 311.

A conductive layer 450 may be further formed below the optical substrate 410. The conductive layer 450 includes a first conductive layer 451 formed below the second surface 412 and a second conductive layer 452 formed below the first conductive layer 451. The conductive layer 450 may act as the ground during a transfer process.

The first conductive layer 451 may be formed of a transparent conductive oxide (TCO), e.g., ITO. The first conductive layer 451 may completely cover the second surface 412. According to an embodiment, the first conductive layer 451 may be a translucent metallic film. A thickness of the first conductive layer 451 may be several nanometers to tens of micrometers. The first conductive layer 451 may have a transmittance of 80% or more in a wavelength region of the light source.

The second conductive layer 452 may be a patterned metallic film or a patterned metallic sheet. In detail, the second conductive layer 452 includes an opening 453 patterned to correspond to a portion corresponding to the emission area of the display substrate 311. The second conductive layer 452 may have a mesh-type pattern, as illustrated in FIG. 5. The first conductive layer 451 may be a thin-film conductive layer, whereas the second conductive layer 452 may be a thick-film conductive layer.

According to an embodiment, instead of directly forming the thin-film first conductive layer 451 and/or the thick-film second conductive layer 452 below the optical substrate 410, a separately prepared metallic sheet may be located below the second surface 412 of the optical substrate 410 during a transfer process.

Figure 6:
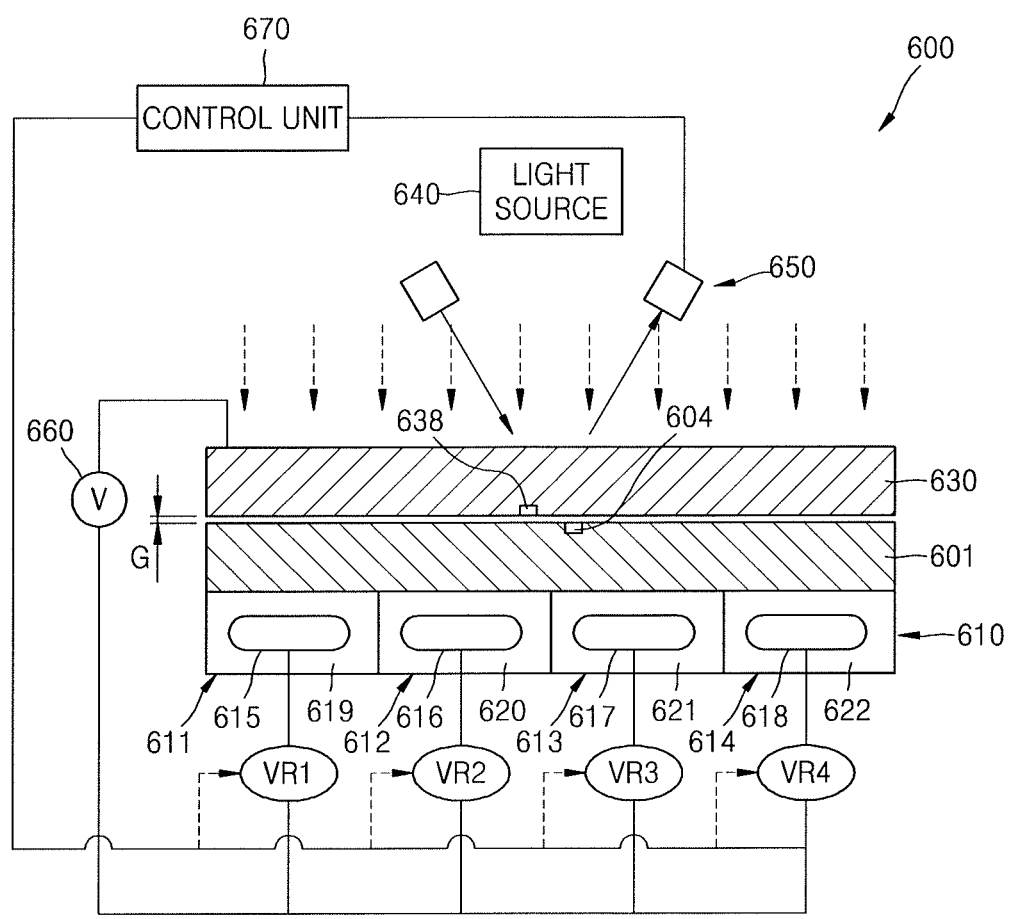
FIG. 6 illustrates a configuration diagram of an electrostatic chuck system according to an embodiment.

FIG. 6 is a configuration diagram of an electrostatic chuck system 600 according to an embodiment.

Referring to FIG. 6, the electrostatic chuck system 600 includes an electrostatic chuck 610.

A display substrate 601 for forming a transfer layer may be mounted on the electrostatic chuck 610. An optical photomask 630 is mounted on the display substrate 601. A light source 640 is mounted on, e.g., above, the optical photomask 630.

When a predetermined voltage is applied between the electrostatic chuck 610 and the optical photomask 630, the display substrate 601 and the optical photomask 630 may be electrostatically adsorbed onto the electrostatic chuck 610. When the display substrate 601 and the optical photomask 630 closely contact each other by an electrostatic force, a gap G may exist between the display substrate 601 and the optical photomask 630 due to surface states of the display substrate 601 and the optical photomask 630, foreign substances, or the like. As the gap G between the display substrate 601 and the optical photomask 630 increases, a bad pattern of a transfer layer formed on the display substrate 601 may occur. Therefore, it is necessary to maintain the gap G between the display substrate 601 and the optical photomask 630 uniform before or during a transfer process of a transfer layer.

To this end, the electrostatic chuck 610 includes a plurality of unit chucks, e.g., first to fourth unit chucks 611 to 614. According to an embodiment, the plurality of unit chucks 611 to 614 are not limited to any structure if two or more of the plurality of unit chucks 611 to 614 are arranged to adjoin each other in each of horizontal and vertical directions. The display substrate 601 may be arranged across the plurality of unit chucks 611 to 614.

Each of the plurality of unit chucks 611 to 614 includes at least one electrode 615, 616, 617, or 618. The electrodes 615 to 618 may be buried by dielectric layers 619 to 622, respectively. Variable resistance units VR1 to VR4 may be electrically connected to the electrodes 615 to 618, respectively. A voltage may be applied to the plurality of unit chucks 611 to 614 through the variable resistance units VR1 to VR4, respectively. The gap G may be adjusted for each position according to a variable change in resistance.

A gap measuring meter 650 may be mounted on the optical photomask 630 to be spaced apart a predetermined distance from the optical photomask 630. The gap measuring meter 650 may measure the gap G between the display substrate 601 and the optical photomask 630.

In detail, the gap measuring meter 650 may measure the gap G by irradiating light on a plurality of light-reflective patterns 604 and 638 respectively formed on facing surfaces of the display substrate 601 and the optical photomask 630 and measuring a path difference of reflected light. The plurality of light-reflective patterns 604 and 638 may be formed in a non-emission area of the display substrate 601 and the optical photomask 630, and may be patterned for each of the plurality of unit chucks 611 to 614. According to an embodiment, the light-reflective patterns 604 and 638 formed for one unit chuck 611, 612, 613, or 614 may be formed at locations apart from each other in the vertical direction.

The variable resistance units VR1 to VR4 may be connected to the plurality of unit chucks 611 to 614, respectively. A resistance value may be variably changed by regulating a power source unit 660.

The variable resistance units VR1 to VR4, the gap measuring meter 650, and the power source unit 660 are connected to a control unit 670. The control unit 670 may transmit a signal for adjusting the gap G between the display substrate 601 and the optical photomask 630.

A laser system or a flash lamp may be used for the light source 640. When light emitted by the light source 640 is irradiated on the optical photomask 630, a transfer layer of the optical photomask 630 may be transferred onto the display substrate 601.

Figure 7:
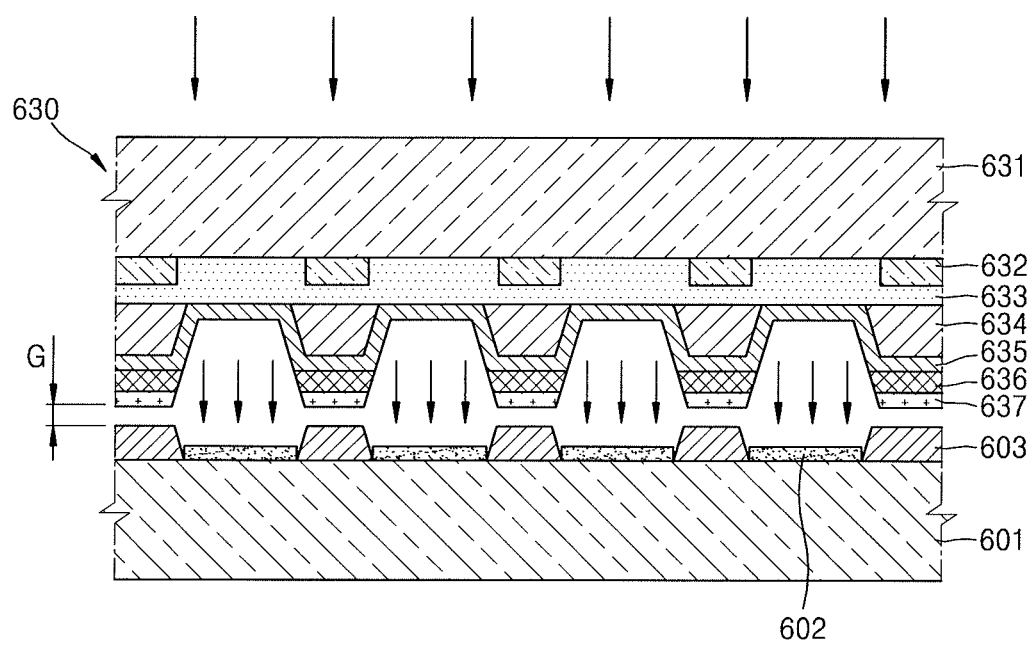
FIG. 7 illustrates a cross-sectional view of a display substrate and an optical photomask arranged in the electrostatic chuck system of FIG. 6.

FIG. 7 is a cross-sectional view of the display substrate 601 and the optical photomask 630 arranged in the electrostatic chuck system 600 of FIG. 6.

Referring to FIG. 7, a pixel-defining layer 603 is formed on the display substrate 601. The pixel-defining layer 603 defines each emission area. A transfer layer 602 may be formed in each emission area defined by the pixel-defining layer 603. According to the present embodiment, the transfer layer 602 may be an organic emission layer.

The optical photomask 630 is mounted on the display substrate 601. The optical photomask 630 is identical to the optical photomask 400 described previously with reference to FIG. 4.

The optical photomask 630 includes an optical substrate 631, a plurality of insulating layers 633, 634, and 636 between which an optical reflective layer 632 is formed below the optical substrate 631 at a portion corresponding to the non-emission area of the display substrate 601, and an optical absorption layer 635 is formed below the optical substrate 631 at a portion corresponding to an emission area of the display substrate 601, and a transfer layer 637 to be transferred to the emission area of the display substrate 601. When predetermined thermal energy is applied from the light source 640 (FIG. 6) to the optical photomask 630, the transfer layer 637 contacting the optical absorption layer 635 is transferred onto the emission area of the display substrate 601 as indicated by arrows.

Figure 8:
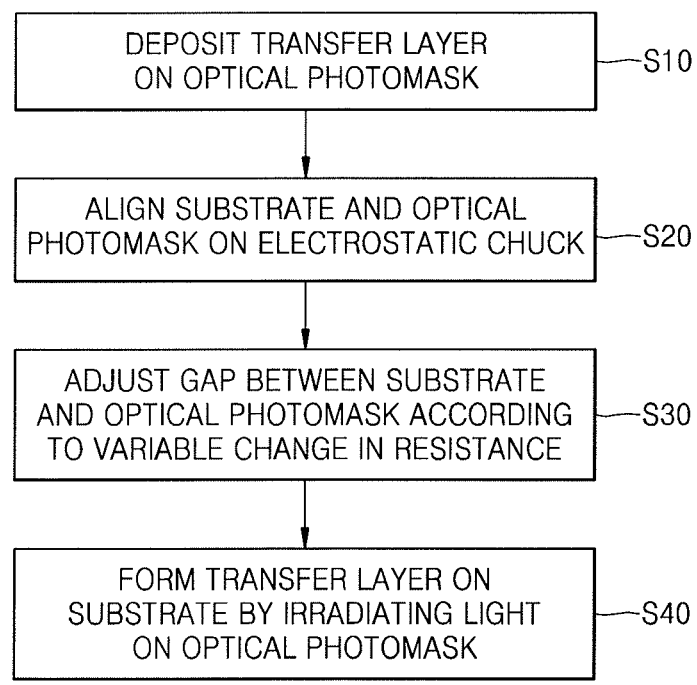
FIG. 8 illustrates a flowchart of a process of forming a transfer layer on a display substrate by using the electrostatic chuck system of FIG. 6, according to an embodiment.

A process of transferring the transfer layer 637 onto the display substrate 601 by using the electrostatic chuck system 600 will now be described with reference to FIGS. 6-8.

In operation S10, the transfer layer 637 is deposited below the optical photomask 630. The optical reflective layer 632 and the optical absorption layer 635 are formed below one surface of the optical photomask 630. The transfer layer 637 directly contacting at least a portion of the optical absorption layer 635 is formed below the optical absorption layer 635. In detail, predetermined heat is applied to a deposition source having an organic material, and the organic material vaporized due to the heat may be deposited below the optical absorption layer 635. This deposition process is performed through a pattern mask, and thus, the transfer layer 637 may be deposited at a portion corresponding to the emission area of the display substrate 601.

In operation S20, the display substrate 601 and the optical photomask 630 are aligned on the plurality of unit chucks 611 to 614. When a predetermined voltage is applied to the plurality of unit chucks 611 to 614, the display substrate 601 and the optical photomask 630 may be electrostatically adsorbed to the plurality of unit chucks 611 to 614. The display substrate 601 and the optical photomask 630 may closely contact each other. However, when the display substrate 601 and the optical photomask 630 closely contact each other by an electrostatic force, the gap G may exist between the display substrate 601 and the optical photomask 630. The gap G needs to be maintained uniform.

In operation S30, the gap G between the display substrate 601 and the optical photomask 630 is adjusted according to a variable change in resistance. The gap G between the display substrate 601 and the optical photomask 630 is adjusted by regulating a voltage through the variable resistance units VR1 to VR4 respectively connected to the plurality of unit chucks 611 to 614.

To adjust the gap G, the gap G between the display substrate 601 and the optical photomask 630 is first measured. In detail, light is irradiated from the gap measuring meter 650 mounted on the optical photomask 630 onto the plurality of light-reflective patterns 604 and 638 respectively formed on the facing surfaces of the display substrate 601 and the optical photomask 630. By doing this, the gap G between the display substrate 601 and the optical photomask 630 may be measured from a path difference of light reflected from the plurality of light-reflective patterns 604 and 638.

A measurement value measured for each position of the display substrate 601 and the optical photomask 630 is transmitted to the control unit 670. The control unit 670 transmits a resistance value for adjusting the gap G to each of the plurality of unit chucks 611 to 614.

The gap G between the display substrate 601 and the optical photomask 630 is adjusted by regulating a voltage to be applied to each of the plurality of unit chucks 611 to 614 through the variable resistance units VR1 to VR4 respectively connected to the plurality of unit chucks 611 to 614. That is, the gap G between the display substrate 601 and the optical photomask 630 may be adjusted by regulating the voltage to be applied to each of the plurality of unit chucks 611 to 614 according to a variable resistance value transmitted from the control unit 670.

According to an embodiment, the variable resistance value may be variably changed by the control unit 670 in real-time. According to an embodiment, a same voltage may be applied to the plurality of unit chucks 611 to 614, and the voltage to be applied to each of the plurality of unit chucks 611 to 614 may be regulated according to the gap G between the display substrate 601 and the optical photomask 630.

For example, a same voltage may be applied to the plurality of unit chucks 611 to 614. In this case, if a first gap corresponding to the first unit chuck 611 between the display substrate 601 and the optical photomask 630 is relatively narrower than any other region, and a second gap corresponding to the second unit chuck 612 between the display substrate 601 and the optical photomask 630 is relatively wider than other regions, a voltage to be applied to the first unit chuck 611 is lowered and a voltage to be applied to the second unit chuck 612 is raised.

In this way, a charge amount accumulated between the display substrate 601 and the optical photomask 630 may be adjusted by regulating a voltage. Accordingly, the gap G between the display substrate 601 and the optical photomask 630 may be maintained uniform. The voltage regulation may vary according to a variable change in resistance.

In operation S40, the transfer layer 602 is formed on the display substrate 601 by applying thermal energy from the light source 640 to the optical photomask 630. In detail, light emitted from the light source 640 is irradiated on the optical photomask 630. A laser system or a flash lamp may be used for the light source 640. The light emitted from the light source 640 may be absorbed by the optical absorption layer 635. In addition, the light emitted from the light source 640 may be reflected from the optical reflective layer 632.

When the light emitted from the light source 640 is absorbed by the optical absorption layer 635, the organic material of the transfer layer 637 contacting the optical absorption layer 635 is vaporized. The vaporized organic material may be transferred to the emission area on the display substrate 601, thereby forming the transfer layer 602 in the emission area.

Figure 9:
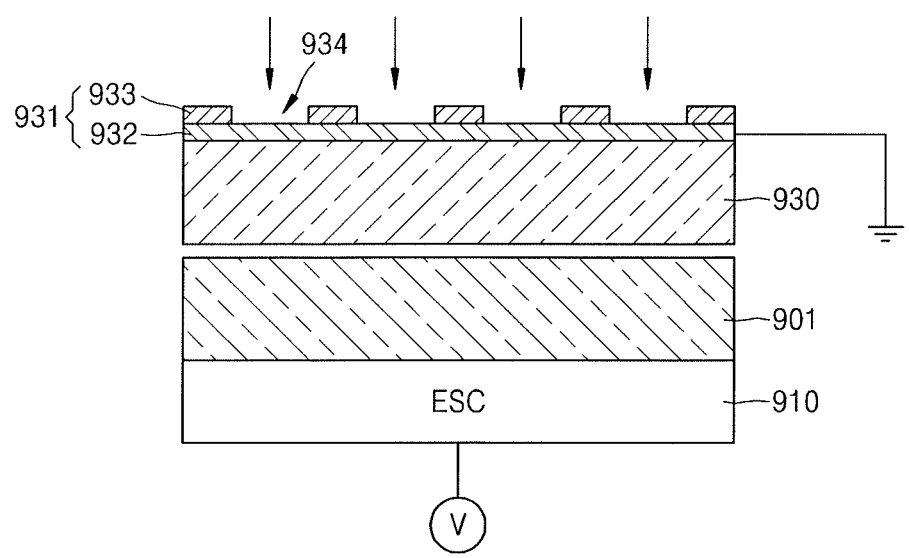
FIG. 9 illustrates a cross-sectional view of an electrostatic chuck, a display substrate, and an optical photomask arranged according to another embodiment.

FIG. 9 is a cross-sectional view of an electrostatic chuck 910, a display substrate 901, and an optical photomask 930 arranged according to another embodiment.

Referring to FIG. 9, the display substrate 901 is mounted on the electrostatic chuck 910. As described above, the electrostatic chuck 910 includes a plurality of unit chucks. A variable resistance unit may be independently connected to each of the plurality of unit chucks. A resistance value may vary by regulating a power source unit.

The optical photomask 930 is mounted on the display substrate 901. As described above, the optical photomask 930 includes an optical reflective layer formed at a portion corresponding to a non-emission area of the display substrate 901, an optical absorption layer formed at a portion corresponding to an emission area of the display substrate 901, and a transfer layer of which a transfer material is to be transferred to the emission area of the display substrate 901.

According to the present embodiment, a conductive layer 931 may be formed on the optical photomask 930. The conductive layer 931 includes a first conductive layer 932 formed on a rear surface of the optical photomask 930 and a second conductive layer 933 formed on the first conductive layer 932. The conductive layer 931 may act as the ground during a transfer process.

In detail, the first conductive layer 932 may be a transparent conductive film. The first conductive layer 932 may be deposited on the rear surface of the optical photomask 930. The second conductive layer 933 may be a metallic thin film. The second conductive layer 933 includes an opening 934 patterned to correspond to the portion corresponding to the emission area of the display substrate 901.

The optical photomask 930 may be electrically grounded by depositing the first conductive layer 932 on the rear surface of the optical photomask 930. The second conductive layer 933 in an open mask form may be formed on the first conductive layer 932 and may act as an auxiliary ground. Accordingly, an electrical equipotential may be achieved all over the optical photomask 930.

According to an embodiment, a separate metallic sheet may be located at the rear surface of the optical photomask 930 instead of forming the thin-film first conductive layer 932 and/or the thick-film second conductive layer 933, so that the optical photomask 930 is grounded.

According to an embodiment, since light for transfer patterning is irradiated from a rear surface of the optical photomask 930 as indicated with arrows, it is recommended that the conductive layer 931 for electrical grounding has a transmittance of 80% or more in a wavelength region of a light source.

As described above, according to an electrostatic chuck system and a method of manufacturing an organic light-emitting display apparatus by using the same according to the one or more of the above exemplary embodiments, a minutely patterned transfer layer may be formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electrostatic chuck system, comprising:
   an electrostatic chuck with a plurality of unit chucks supporting a display substrate;
   a mask on the display substrate, the mask having a material to be transferred onto the display substrate;
   a gap measuring meter for measuring a gap between the display substrate and the mask;
   a power source unit for applying power to each of the plurality of unit chucks through variable resistance units respectively connected to the plurality of unit chucks; and
   a control unit electrically connected to the gap measuring meter, the variable resistance units, and the power source unit, and transmits a signal for adjusting the gap.

2. The electrostatic chuck system as claimed in claim 1, wherein each of the plurality of unit chucks includes:
   at least one electrode electrically connected to a corresponding variable resistance unit; and
   a dielectric layer burying the at least one electrode.

3. The electrostatic chuck system as claimed in claim 2, wherein the plurality of unit chucks are arranged to adjoin each other, and the display substrate is arranged on and across the plurality of unit chucks.

4. The electrostatic chuck system as claimed in claim 1, wherein the gap measuring meter is mounted apart from the mask to measure a path difference of light irradiated onto a light-reflective pattern on each of facing surfaces of the display substrate and the mask.

5. The electrostatic chuck system as claimed in claim 1, wherein each of the variable resistance units is independently connected for each unit chuck, and a resistance value thereof is variably changed by regulating the power source unit.

* * * * *